United States Patent [19]

Yachi

[11] Patent Number: 5,232,537
[45] Date of Patent: Aug. 3, 1993

[54] DRY ETCHING APPARATUS
[75] Inventor: Masaharu Yachi, Suwa, Japan
[73] Assignee: Seiko Epson Corporation, Tokyo, Japan
[21] Appl. No.: 774,860
[22] Filed: Oct. 11, 1991
[30] Foreign Application Priority Data Oct. 12, 1990 [JP] Japan .................. 2-273622
Sep. 26, 1991 [JP] Japan .................. 3-247301

[51] Int. Cl.⁵ .................................... H01L 21/00
[52] U.S. Cl. ................................... 156/345; 156/626; 156/643; 118/723
[58] Field of Search ............ 156/345, 626, 627, 643; 118/723

[56] References Cited

U.S. PATENT DOCUMENTS

| | | | |
|---|---|---|---|
| 4,312,732 | 1/1982 | Degenkolb et al. | 156/643 |
| 4,569,592 | 2/1986 | Osada et al. | 156/626 |
| 5,002,631 | 3/1991 | Giapis et al. | 156/626 |

FOREIGN PATENT DOCUMENTS

| | | |
|---|---|---|
| 60-035519 | 2/1985 | Japan . |
| 62-176131 | 8/1987 | Japan . |
| 63-012139 | 1/1988 | Japan . |
| 63-076435 | 4/1988 | Japan . |
| 2-035723 | 2/1990 | Japan . |

OTHER PUBLICATIONS

Bondur et al.; "Counter—Electrode Structure for End-Point Detection"; IBM Technical Disclosure; vol. 22; No. 10, Mar. 1980.

Primary Examiner—Brian E. Hearn
Assistant Examiner—George Goudreau
Attorney, Agent, or Firm—Sughrue, Mion, Zinn, Macpeak & Seas

[57] ABSTRACT

Plasma light beams emitted from a plurality of monitoring areas on a wafer are introduced via windows and optical fibers, respectively, and detected by a detector. The detector determines etching end times of the respective monitoring areas. A calculating section calculates a maximum allowable etching end time based on the first-determined etching end time and a predetermined uniformity standard. If the etching ends of all the monitoring areas have not been determined at the time point of the calculated maximum allowable etching end time, a controller immediately stops the etching process.

6 Claims, 3 Drawing Sheets

DRY ETCHING APPARATUS

BACKGROUND OF THE INVENTION

The present invention relates to control of an etching process performed by dry etching apparatuses.

In conventional dry etching apparatuses, etching characteristics such as an etching rate and a uniformity are monitored by etching a dummy wafer. And if the etching characteristics are deviated from the standard values, the apparatus is cleaned.

FIG. 2 shows an example of a conventional ECR plasma etching apparatus. A wafer 13 is placed in a reaction chamber 1 made of quartz glass. Gases are introduced into the chamber 1 through a gas inlet 2, ionized to become a plasma by a combined action of a microwave which is generated by a magnetron 4 and introduced by a waveguide 5 and a magnetic field generated by solenoid coils 6. Resultant plasma particles are made incident on the wafer 13 by a radio-frequency voltage from a radio-frequency voltage supply 7, to etch the wafer 13. Reference numeral 3 denotes a gas outlet.

For example, using the apparatus of FIG. 2, a polycrystalline silicon layer formed on an $SiO_2$ layer is etched in the following manner. A $C_2Cl_2F_4$ gas and a $SF_6$ gas are introduced into the chamber 1 by amounts of 63 and 7 SCCM, respectively, and a pressure is set at 10 mTorr. Powers of the microwave and radio-frequency voltage are set at 300 and 160 W, respectively. Plasma light emitted from the wafer 13 is provided to a detector 10 via a window 8 and an optical fiber 9. The detector 10 detects the plasma light to determine an end of the etching. Etching characteristics are monitored, at a certain frequency, by etching a dummy wafer to about a 70%-depth, and measuring a difference in level with a contact-type level-difference measuring device. With this procedure, the etching process can proceed at an etching rate of 3,000 Å/minute with a uniformity of ±5%, for example. If these etching characteristics are maintained, the etching process is performed satisfactorily without incurring such a case that the $SiO_2$ layer is etched out at some portions completely, even if it is as thin as 200 Å.

However, if the etching uniformity exceeds the range of ±10% as the process goes on, there may arise such undesirable phenomena that the $SiO_2$ layer is etched out at peripheral portions of the wafer 13 where the etching rate is high, and that the etching end cannot be determined because of a slowed decreasing rate of the plasma light intensity. Therefore, it is required to etch a dummy wafer at a higher frequency (e.g., one monitoring per 25 wafers) to monitor the etching characteristics.

Thus, in prior art apparatuses, the etching characteristics are measured using a dummy wafer, which requires extra time and labor.

SUMMARY OF THE INVENTION

The present invention has been made in view of the above problem of the prior art, and therefore, an object of the invention is to provide a dry etching apparatus in which etching parameters can be measured while a wafer is actually being etched.

According to the invention, a dry etching apparatus in which a gas introduced into a chamber is ionized to become a plasma to etch a layer formed on a semiconductor wafer, comprises:

window means for taking out light beams emanating from a plurality of monitoring areas on the wafer, the light beams representing a thickness of the layer at the respective monitoring areas;

means for detecting the light beams to determine etching end times of the respective monitoring areas;

means for calculating etching parameters including a uniformity based on the determined etching end times; and means for controlling an etching process based on the calculated etching parameters.

DESCRIPTION OF THE PREFERRED EMBODIMENTS

The embodiments of the present invention will be described hereinafter with reference to the accompanying drawings.

Figure 1:
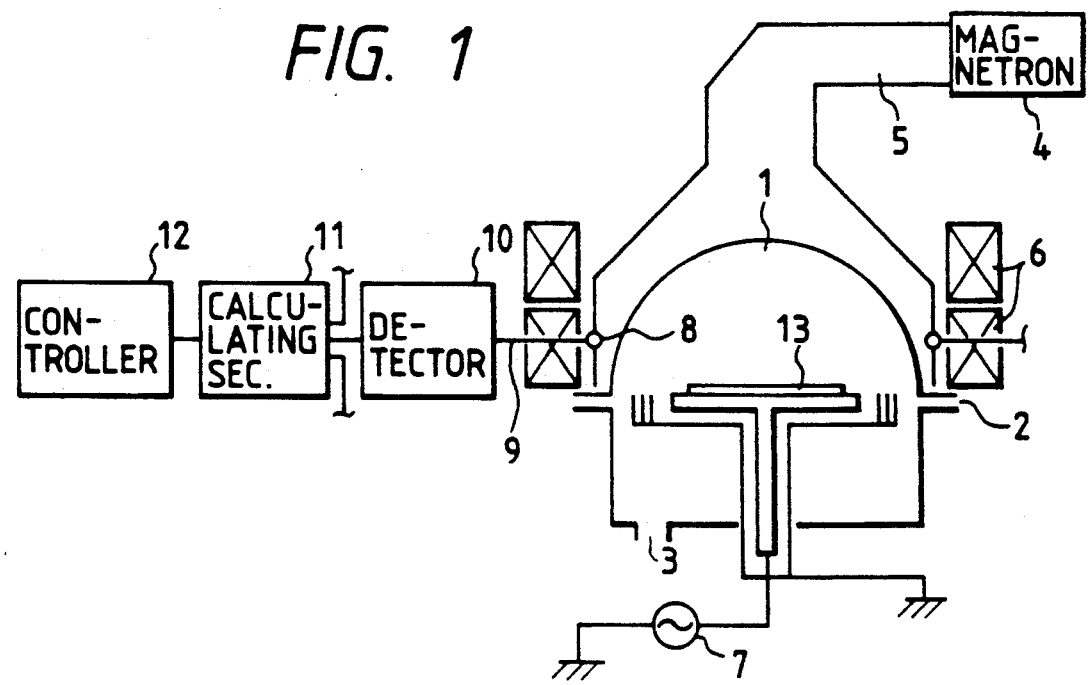
FIG. 1 is a schematic diagram showing an ECR plasma etching apparatus according to a first and a second embodiment of the present invention.
Figure 2:
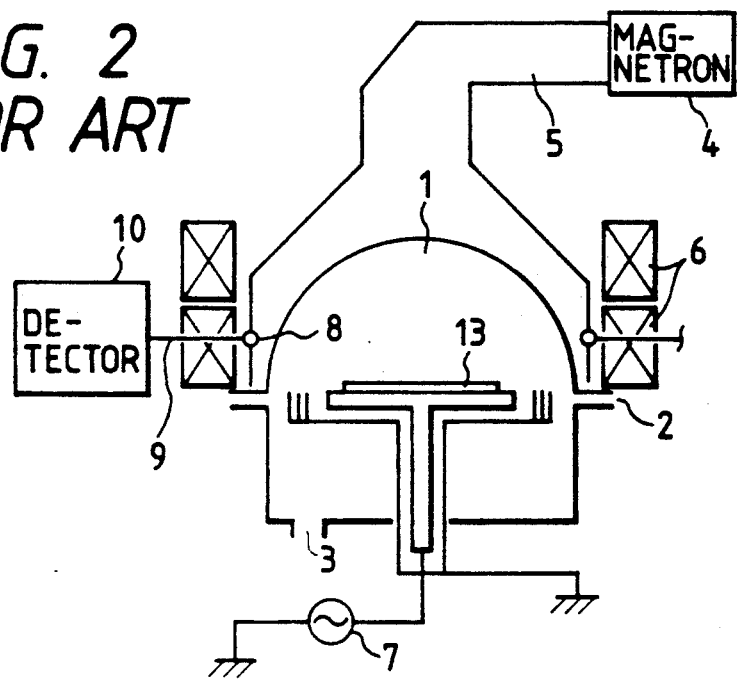
FIG. 2 is a schematic diagram showing a conventional ECR plasma etching apparatus.

FIG. 1 shows an ECR plasma etching apparatus to which the present invention is applied. In FIG. 1, the same parts as the conventional apparatus of FIG. 2 are designated by the same reference numerals, and detailed explanations therefor will be omitted.

In the apparatus of FIG. 1, plasma light emitted due to an etching reaction is detected to judge an end of the etching. Windows 8 are formed in the wall of a waveguide 5 in accordance with the number of monitoring areas on a wafer 13. The plasma light passes through the window 8, and is introduced by an optical fiber 9 to a detector 10. The detector 10 judges an end of the etching, i.e., determines an etching end time for each monitoring area.

A calculating section 11 calculates an etching rate and uniformity from a pre-input thickness of a layer to be etched and the etching end time sent from the detector 10, according to the following formulae:

Etching rate $R$ (Å/min)

$= 60\{\text{layer thickness (Å)}\}/\{\text{etching end time (sec)}\}$.

Uniformity
$(\%) = 100(R_{max} - R_{min})/(R_{max} + R_{min})$ where $R_{max}$ and $R_{min}$ represent a maximum and a minimum etching rate, respectively. These two kinds of etching parameters are provided to a controller 12, which performs etching process control (stops the etching process, for instance).

A first embodiment of the invention will be described of a case in which a polycrystalline silicon layer of 4,000-Å thickness formed over a silicon substrate via an $SiO_2$ layer of 200-Å thickness is etched using the dry etching apparatus of FIG. 1.

A $C_2Cl_2F_4$ gas and a $SF_6$ gas are introduced into the chamber 1 by amounts of 63 and 7 SCCM, respectively. The pressure in the chamber 1, power of 2.45 GHz microwave and power of 13.56 MHz radio-frequency voltage are set at 10 mTorr, 300 W and 160 W, respectively.

Figure 3:
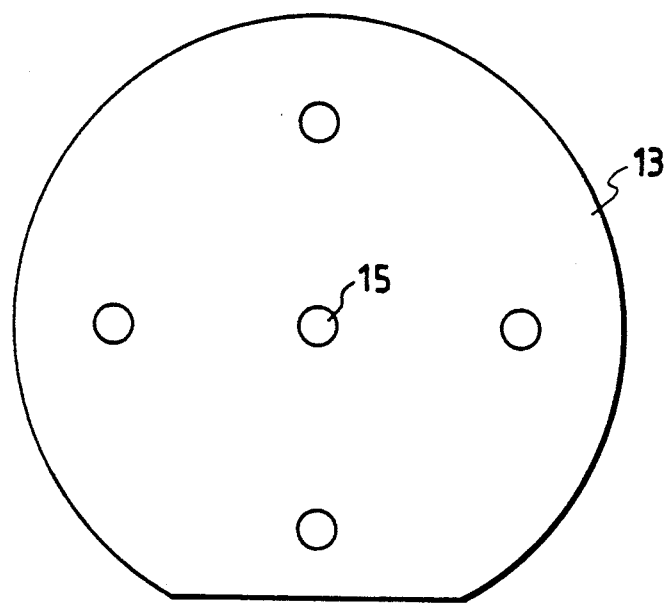
FIG. 3 is a plan view showing monitoring areas on a wafer.

FIG. 3 shows light emission detecting areas, i.e., monitoring areas 15 on the wafer 13, which includes one area at the center and four areas in the peripheral portion. The reason why the central area and the peripheral areas are selected as the monitoring areas 15 is that in the situation of the first embodiment the etching rate increases from the center toward the periphery. Each monitoring area 15 is a spot having a diameter of 1 cm. Light emitted from each monitoring area 15 is focused by a lens (not shown) placed in the window 8 on the end face of the optical fiber 9. Five windows 8 and five optical fibers 9 are provided corresponding to the number of the monitoring areas 15.

Figure 4:
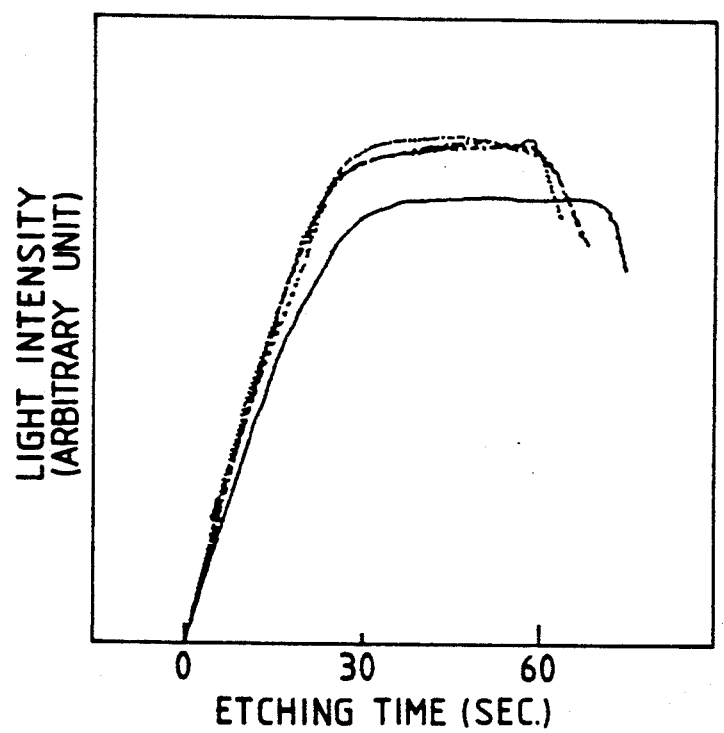
FIG. 4 is a graph showing a variation of plasma light intensity.

FIG. 4 shows intensity variation data of 440-nm plasma light emitted from Si—F which is produced by the etching reaction. The data of FIG. 4 were obtained at the initial stage of the etching process of wafers 13. Since light emitted from the spot-like monitor area 15 is detected, the detected light intensity falls abruptly as shown in FIG. 4 and, therefore, the etching end can easily be determined. The etching end determination can be performed based on the slope of the intensity variation (differentiation or difference) or based on the intensity itself (for instance, detection of 10% decrease from the peak).

Etching end times determined by the detector 10 were 75 seconds at the wafer center and 67, 65, 68 and 65 seconds at the peripheral areas. Etching rates of the respective monitoring areas were calculated by the calculating section 11 as 3,200, 3,582, 3,692, 3,530 and 3,692 Å/min, and the uniformity was calculated as ±7.1%. The side shape of the etched patterns was vertical, and the $SiO_2$ layer remained at all portions.

An experiment was again made under the same conditions as described above to obtain etching end times at the intermediate stage when the accumulated number of etched wafers has reached 1,000. Etching end times were calculated as 87, 72, 68, 73 and 75 seconds, and the uniformity was deteriorated to ±12.2%. In this experiment, the etching was stopped at the time point when the etching end of the monitoring area 15 having the lowest etching rate was determined. In this case, at the peripheral portions having higher etching rates, the $SiO_2$ layer was etched out and the etching proceeded to the silicon substrate. This is because the maximum difference between etching end times is as large as 19 seconds while the etching rate of the $SiO_2$ layer is approximately 1,000 Å/min.

In the above state, it is expected that remaining wafers will not be subjected to satisfactory etching. In other words, the cleaning of the apparatus is required.

In the first embodiment, the etching control is performed in the following manner. First, the maximum etching rate (Rmax) is calculated by the calculating section 11 from the etching end time of the monitoring area whose etching end has been first determined. Then, calculated is the maximum allowable etching end time corresponding to the standard value of the uniformity, ±10% which is stored in the controller 12 in advance. If the etching ends of all the monitoring areas 15 have not been determined at the time point of the above-calculated maximum allowable etching end time, the controller 12 immediately stops the etching, to avoid producing faultily etched wafers. For example, at the stage of 1,000 accumulated etched wafers, the first-determined etching end time is 68 seconds, and using this value the maximum allowable etching end time, which corresponds to the uniformity standard of ±10%, is calculated as 83 seconds. The etching is stopped at this time point at the latest.

A second embodiment will be described of a case in which an Al/1%-Si layer of 1.0-μm thickness formed over a polycrystalline silicon or silicon substrate via an $SiO_2$ layer of 3,000-Å thickness is etched, using the ECR plasma etching apparatus of FIG. 1.

In this case, a $BCl_3$ gas and a $Cl_2$ gas are introduced into the chamber 1 by amounts of 60 and 90 SCCM, respectively, and the pressure is set at 20 mTorr. Powers of the microwave and the radio-frequency voltage are set at 400 and 200 W, respectively. The etching end is determined by detecting 396-nm light emitted from aluminum. The light intensity variation assumes a curve similar to that of FIG. 4. Further, the monitoring areas 15 are arranged also in the same manner as in FIG. 3.

An example of a set of etching end times at the initial stage of an etching process were 70 seconds at the center and 60, 62, 62 and 61 seconds at the peripheral areas. The uniformity is calculated as ±7.7%.

Aluminum layers are usually used for an interconnection process which is the final fabrication step, and are formed even at portions having a relatively large step. Even if the thickness of the aluminum layer is, e.g., 1.0 μm at flat portions, it may be about 1.5 μm at step portions. Therefore, in the case of etching aluminum layers, the 50% over-etching is performed after determination of the etching end (for the flat portions). However, the etching uniformity is deteriorated as the etching process proceeds, the following undesirable phenomena will occur: incomplete etching of the aluminum layer at low-etching-rate portions, and excessive etching of the $SiO_2$ layer at high-etching-rate portions. The latter phenomenon will deteriorate the inter-layer dielectric breakdown characteristic.

Therefore, an appropriate standard of the uniformity should be used. In the second embodiment under consideration, the uniformity standard, which is to be stored in the controller 12, is set at ±10% to include some margin.

A third embodiment will be described of a case in which an $SiO_2$ layer of 3,000-Å thickness formed on a silicon substrate is etched to leave an $SiO_2$ side wall, using a cathode-coupled RIE apparatus shown in FIG. 5.

Figure 5:
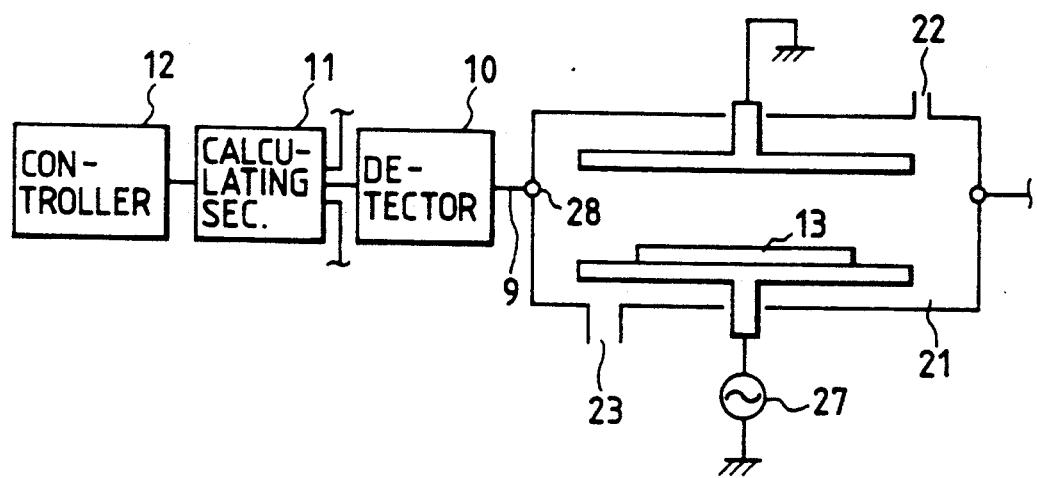
FIG. 5 is a schematic diagram showing a cathode-coupled RIE apparatus according to a third embodiment of the invention.

In FIG. 5, a $CHF_3$ gas and a $C_2F_6$ gas are introduced from a gas inlet 22 by amounts of 120 and 50 SCCM, respectively into a reaction chamber 21 in which a wafer 13 is positioned. The pressure is set at 200 mTorr, and power of a radio-frequency voltage supply 27 is set at 800 W. Reference numeral 23 denotes a gas outlet. The construction of windows 28, optical fibers 9, a detector 10, a calculating section 11 and controller 12 are basically the same as that of the apparatus of FIG. 1.

The etching end is determined by detecting 450-nm light emitted from C—O which is produced by the etching reaction. The light intensity variation is similar to that of FIG. 4. The arrangement of monitor areas 15 on the wafer 13 are also the same as that of the first and second embodiment (FIG. 3).

An example of a set of etching end times at the initial stage of the etching process were 35 seconds at the center and 36, 37, 36 and 36 seconds at the peripheral monitoring areas. The etching uniformity is calculated as ±2.8%.

If the uniformity deteriorates as the etching process proceeds, even the silicon substrate may be etched, or the shoulder of the $SiO_2$ side wall may become remarkable, prohibiting the satisfactory functioning of resultant semiconductor devices. To avoid this problem, the uniformity standard of the third embodiment is set at ±3%.

It is noted that the etching apparatus and etching conditions of the invention are not limited to those of the embodiments. Since the allowable uniformity level varies with the etching conditions, the uniformity standard is not limited to the values of the embodiments. The number of the monitoring areas can be selected arbitrarily, and so not limited to five. The number can be reduced by properly shaping the windows. Further, it is necessary to change the spot size of the monitoring area depending on the pattern of a layer to be etched.

Light used for the etching end determination is not limited to plasma light emitted from products of etching reaction, as is employed in the embodiments. If a transparent layer is to be etched, laser light may externally be provided to illuminate the monitoring area and reflected laser interference light may be utilized.

According to the present invention, light beams emanating from a plurality of monitoring areas are detected, and etching parameters such as the uniformity can be calculated during the actual etching process, without using a dummy wafer. Therefore, the invention provides the advantages of an improvement of the throughput, and prevention of an unallowable variation of the etching characteristics and occurrence of faulty etching.

What is claimed is:

1. A dry etching apparatus in which a gas introduced into a chamber is ionized to become a plasma to etch a layer formed on a semiconductor wafer, comprising:
   window means provided on the periphery of said chamber for receiving light beams emanating from a plurality of monitoring areas on the wafer, the light beams representing a thickness of the layer at the respective monitoring areas;
   means for detecting the light beams received by said window means to determine etching end times of the respective monitoring areas;
   means for calculating etching parameters including a uniformity of etching rate in said monitoring areas based on the determined etching end times; and
   means for controlling an etching process based on the calculated etching parameters.

2. The apparatus according to claim 1, wherein the calculating means calculates a maximum allowable etching end time based on a first etching end time which is first detected by the detecting means and a predetermined uniformity standard, and the controlling means immediately stops the etching process if the detecting means has not detected the etching end times of all the monitoring areas at the time point of the maximum allowable end time.

3. The apparatus according to claim 1, wherein the light beams are plasma light beams emitted from etching reaction products.

4. The apparatus according to claim 1, wherein the window means includes a plurality of windows.

5. The apparatus according to claim 4, wherein each of the windows is equipped with a lens for focusing the light beam on an end face of an optical fiber connected to the detecting means.

6. A dry etching apparatus in which a gas introduced into a chamber is ionized to become a plasma to etch a layer formed on a semiconductor wafer, comprising:
   window means provided on the periphery of said chamber for receiving light beams emanating from a plurality of monitoring areas on the wafer, the light beams representing a thickness of the layer at the respective monitoring areas;
   means for detecting the light beams received by said window means to determine etching end times of the respective monitoring areas;
   means for calculating etching parameters including the maximum allowable etching end time based on a first etching end time which is first detected by the detecting means and a predetermined uniformity standard; and
   means for controlling an etching process based on the calculated etching parameters including immediately stopping the etching process if the detecting means has not detected the etching end times of all the monitoring areas at the time point of the maximum allowable end time.

* * * * *